(12) United States Patent
Daycock

(10) Patent No.: US 10,608,003 B2
(45) Date of Patent: *Mar. 31, 2020

(54) INTEGRATED CIRCUITRY AND 3D MEMORY

(71) Applicant: Micron Technology, Inc., Boise, ID (US)

(72) Inventor: David Daycock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/270,702

(22) Filed: Feb. 8, 2019

(65) Prior Publication Data

US 2019/0172833 A1    Jun. 6, 2019

Related U.S. Application Data

(63) Continuation of application No. 15/975,907, filed on May 10, 2018, now Pat. No. 10,224,336, which is a continuation of application No. 14/995,709, filed on Jan. 14, 2016, now Pat. No. 9,985,040.

(51) Int. Cl.
| | | |
|---|---|---|
| *G11C 16/04* | (2006.01) |
| *H01L 27/11551* | (2017.01) |
| *H01L 27/11526* | (2017.01) |
| *H01L 27/11573* | (2017.01) |
| *H01L 27/11578* | (2017.01) |
| *G11C 5/02* | (2006.01) |
| *H01L 27/11582* | (2017.01) |
| *H01L 49/02* | (2006.01) |

(52) U.S. Cl.
CPC ........ *H01L 27/11551* (2013.01); *G11C 5/025* (2013.01); *G11C 16/0483* (2013.01); *H01L 27/11526* (2013.01); *H01L 27/11573* (2013.01); *H01L 27/11578* (2013.01); *H01L 27/11582* (2013.01); *H01L 28/00* (2013.01)

(58) Field of Classification Search
CPC .............. H01L 27/11551; H01L 28/00; H01L 27/11582; H01L 27/11526; H01L 27/11573; H01L 27/11578; G11C 5/025; G11C 16/0483
USPC .................................................. 365/185.18
See application file for complete search history.

(56) References Cited

U.S. PATENT DOCUMENTS

| | | | |
|---|---|---|---|
| 4,525,809 A | 6/1985 | Chiba et al. | |
| 4,780,846 A | 10/1988 | Tanabe et al. | |
| 5,818,748 A * | 10/1998 | Bertin .................... | G11C 5/025 365/51 |

(Continued)

*Primary Examiner* — Tha-O H Bui
(74) *Attorney, Agent, or Firm* — Wells St. John P.S.

(57) ABSTRACT

Integrated circuitry has an array circuitry region having a repeating array of electronic components. An adjacent circuitry region is immediately laterally adjacent to and contacts one elongated major peripheral side of the array circuitry region. The adjacent circuitry region is distinct in structure from the array circuitry region where contacting the array circuitry region and distinct in operation from the array circuitry region. The array circuitry region and the adjacent circuitry region have a respective longitudinally non-linear edge at an interface relative one another along the one elongated major peripheral side of the array circuitry region. Other embodiments are disclosed.

27 Claims, 10 Drawing Sheets

(56) References Cited

U.S. PATENT DOCUMENTS

| | | | |
|---|---|---|---|
| 7,348,680 B2 * | 3/2008 | Rotaru | H01L 23/3107 |
| | | | 257/728 |
| 8,553,445 B2 * | 10/2013 | Baek | G11C 5/025 |
| | | | 365/148 |
| 9,721,663 B1 | 8/2017 | Ogawa et al. | |
| 2011/0063889 A1 | 3/2011 | Fukano | |
| 2014/0197540 A1 | 7/2014 | Do et al. | |
| 2014/0217488 A1 | 8/2014 | Thimmegowda et al. | |

* cited by examiner

Predecessor Substrate

INTEGRATED CIRCUITRY AND 3D MEMORY

RELATED PATENT DATA

This patent resulted from a continuation application of U.S. patent application Ser. No. 15/975,907, filed May 10, 2018, entitled "Integrated Circuitry And 3D Memory", naming David Daycock as inventor, which was a continuation application of U.S. patent application Ser. No. 14/995,709, filed Jan. 14, 2016, entitled "Integrated Circuitry And 3D Memory", naming David Daycock as inventor, now U.S. Pat. No. 9,985,040, the disclosures of which are incorporated by reference.

TECHNICAL FIELD

Embodiments disclosed herein pertain to integrated circuitry and to 3D memory.

BACKGROUND

Memory provides data storage for electronic systems. Flash memory is one type of memory, and has numerous uses in computers and other devices. For instance, personal computers may have BIOS stored on a flash memory chip. As another example, flash memory is used in solid state drives to replace spinning hard drives. As yet another example, flash memory is used in wireless electronic devices as it enables manufacturers to support new communication protocols as they become standardized, and to provide the ability to remotely upgrade the devices for improved or enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Flash memory cell strings have historically been arranged to extend horizontally, although vertically extending memory cell strings are now being considered. One goal in fabrication of vertical memory cell strings is to reduce the horizontal area of the substrate occupied by the memory cells as compared to horizontally extending memory cell strings, albeit typically at the expense of increased vertical thickness. Nevertheless, vertically orienting memory cell strings can create horizontal packing density considerations not present in horizontally oriented memory cell string layouts.

The memory cells of an individual vertically extending string are typically formed in different tiers or levels within a stack of materials in an array circuitry region. A peripheral circuitry region commonly surrounds an individual array region and may include read/write, logic, control/timing, amplifier, and/or other circuitry that may in some way engage with the memory cells in the array circuitry region. The materials in the stack in the array circuitry region include combinations of conductive, semiconductive, and insulative materials many of which are typically deposited blanketly over the entire wafer. These are patterned within the array circuitry region to form the individual vertical strings of memory cells having associated sense and access lines. At some point, the components in the peripheral circuitry region are patterned and which commonly includes removing most or all of the tier materials from the peripheral circuitry region. This may include back-fill with dielectric material that largely replaces the stack of tier materials that were originally in the peripheral circuitry region. The back-filled dielectric, unfortunately, has a tendency to densify and shrink at a much greater rate than occurs, if any, in the stack of tier materials in the array circuitry region. This creates stress and lateral pulling of the array region material toward the peripheral region, particularly in regions closest to the periphery of the array region. This can cause vertical slits that were previously formed within the array circuitry region to widen and/or cause undesirable vertical cracks to form in the stack of tier materials. These may subsequently get filled with conductive material and result in shorts and/or inoperable circuitry.

DETAILED DESCRIPTION OF EXAMPLE EMBODIMENTS

Figure 1:
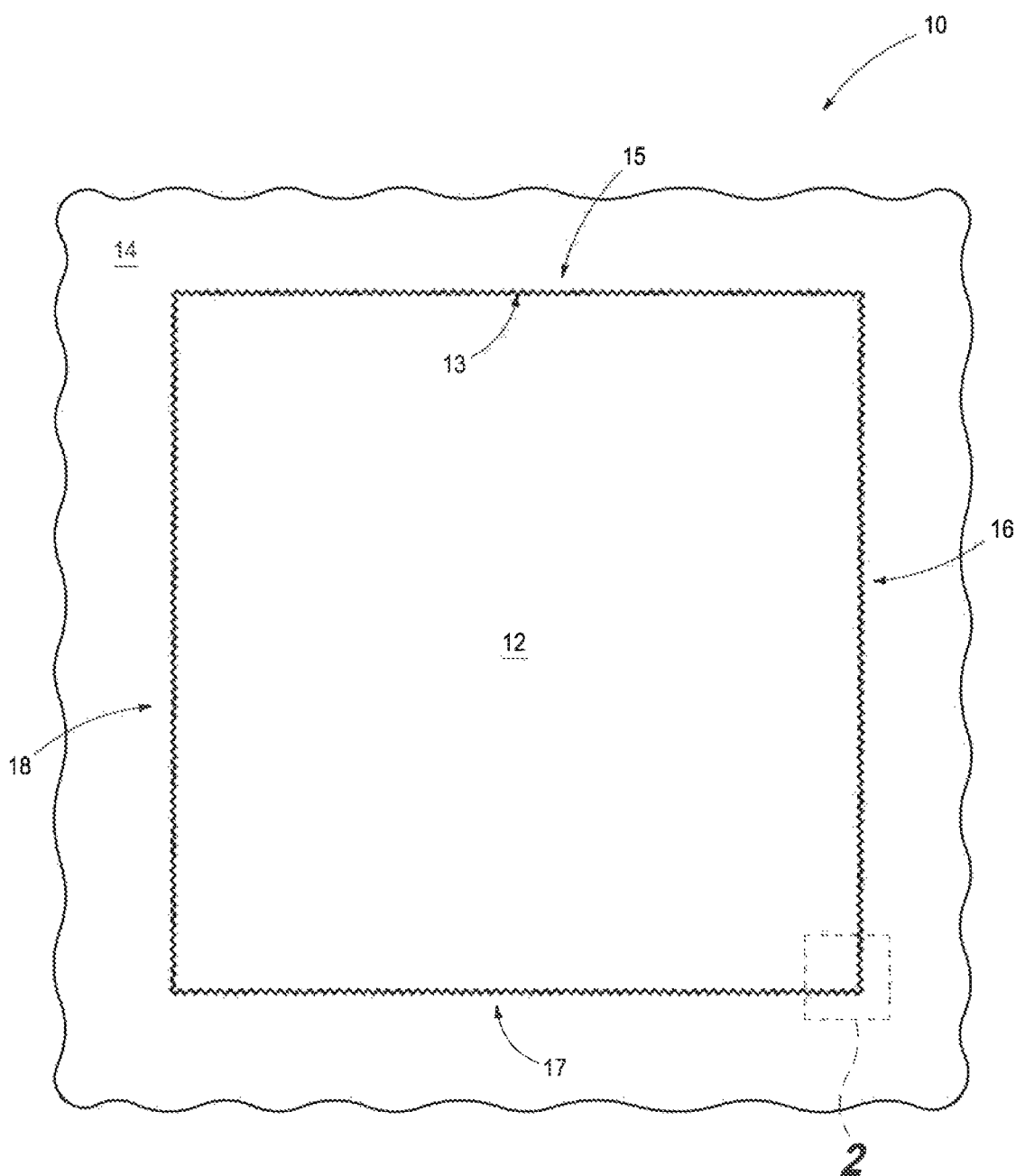
FIG. 1 is a diagrammatic top plan view of a substrate fragment comprising integrated circuitry in accordance with an embodiment of the invention.

Embodiments of the invention include integrated circuitry, with one example being memory circuitry such as 3D memory, 3D flash memory, and/or 3D NAND flash memory. Integrated circuitry in addition to or other than memory is also contemplated, for example logic circuitry and application specific integrated circuitry, and whether existing or yet-to-be-developed. One example embodiment is initially shown and described with reference to FIGS. 1, 2, and 2A which diagrammatically show a top view of a substrate fragment 10, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Integrated circuitry of substrate 10 has an array circuitry region 12 which comprises and is characterized by a repeating array of electronic components (i.e., which may include groups of electronic components). Examples include transistors, transistor gate lines, global and local interconnect lines, capacitors, diodes, resistors, memory cells, etc. Array circuitry region 12 may comprise a memory array, a programmable logic array, or any other existing or yet-to-be-developed array formed as part of integrated circuitry. In one embodiment associated with challenges that motivated the invention, array circuitry region 12 comprises a plurality of elevationally extending strings of memory cells of 3D memory, for example as shown in U.S. Patent Publication Nos. 2015/0279855 and 2015/0333143. Regardless, the array circuitry region would contain thousands if not millions of a repeating array of electronic components, possibly including multiple sub-arrays that might also be fabricated and operate independently, in tandem, or otherwise relative one another. As used in this document, a "sub-array" may also be considered as an "array".

Regardless, the array circuitry region will comprise a periphery having at least one elongated major peripheral side, as may be conventional in the prior art. For example, example array circuitry region 12 has a periphery 13 that includes a plurality of four elongated straight major peripheral sides 15, 16, 17, and 18. The array circuitry region may have fewer or more elongated major peripheral sides, and may be of any polygonal or other two-dimensional closed geometric figure shape considered in a horizontal plane. In this document, "horizontal" refers to a general direction (i.e., within 10 degrees) along a primary surface relative to which the substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational", "upper", "lower", "top", "bottom", "above", "below", "under", and "beneath" are generally with reference to the vertical direction relative to a base substrate upon which the circuitry is fabricated. The elongated major peripheral sides may individually be overall longitudinally straight (as shown), overall curved (not shown), or a combination of straight and curved (not shown). Even if the periphery is circular (not shown), such comprises one elongated major peripheral side which is continuous about the periphery. In this document, "major" of elongated major peripheral side refers to one of the fewest number of no more than four peripheral sides that a region of circuitry can be reduced to wherein it is still of a two-dimensional closed figure shape considered in a horizontal plane and additionally requiring that the circuitry region and adjacent region have a respective longitudinally non-linear edge at an interface relative one another along at least one elongated major peripheral side of such two-dimensional closed figure shape, as described below.

The integrated circuitry will comprise an adjacent circuitry region immediately laterally adjacent to and contacting one elongated major peripheral side (i.e., at least one if more than one) of the array circuitry region. An example such adjacent circuitry region 14 is shown being laterally adjacent to and contacting each of elongated major peripheral sides 15, 16, 17, and 18 of periphery 13, and thereby in one embodiment also surrounding periphery 13, of array circuitry region 12. Example adjacent circuitry region 14 may or may not have plural circuit components along each of peripheral sides 15, 16, 17, and 18. Where array circuitry region 12 comprises a memory array, logic circuitry and/or control circuitry would likely be fabricated within adjacent circuitry region 14. However, control and/or other circuitry for operating the memory array may or may not be partially received within array circuitry region 12, with an example memory array region as a minimum encompassing all of the memory cells of a given array/sub-array. Regardless, adjacent circuitry region 14 is distinct in structure from array circuitry region 12 where contacting array circuitry region 12 and is distinct in operation from array circuitry region 12 (i.e., the array and adjacent circuitry regions as a minimum have such differences relative one another).

Figure 2:
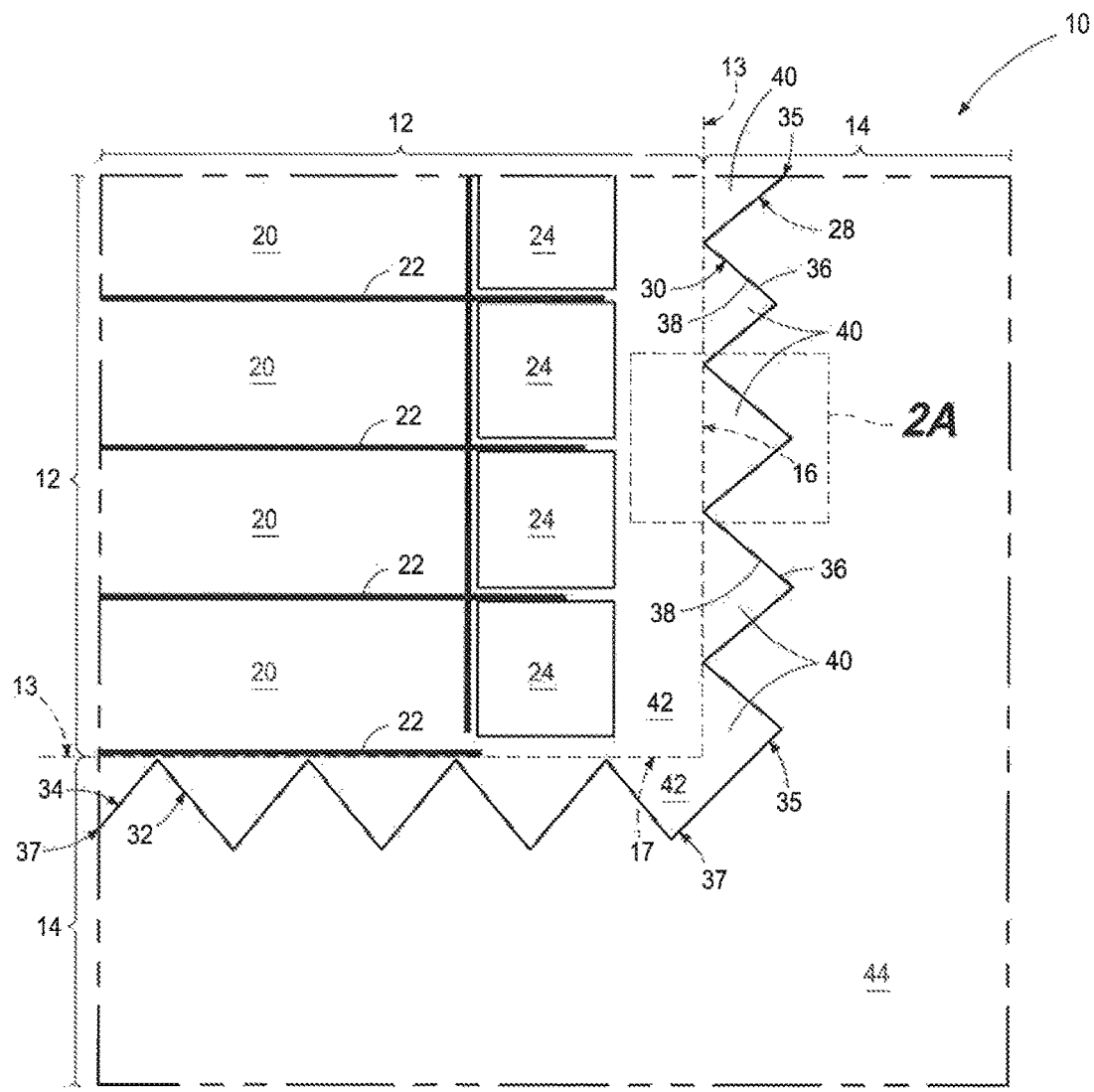
FIG. 2 is an enlarged view of a portion of FIG. 1.
Figure 2A:
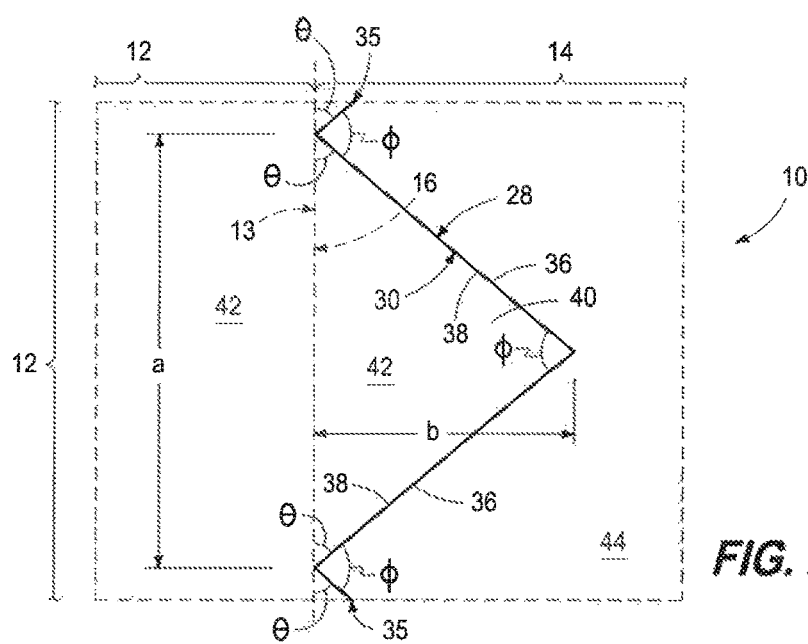
FIG. 2A is an enlarged view of a portion of FIG. 2.

FIG. 2 is an enlargement of the lower-right corner of array circuitry region 12 where it contacts with adjacent circuitry region 14, and FIG. 2A is an enlargement of a portion of FIG. 2. In one example embodiment, array circuitry region 12 comprises a plurality of elevationally extending strings of memory cells (not shown), for example NAND flash, that are arrayed in rectangular block segments 20. By way of example only, on the order of 1000's of individual strings of memory cells may be within a single block segment 20. Immediately-adjacent block segments 20 may be separated from one another by narrow vertical slits 22 filled with dielectric material (example vertical slits being shown by solid bold lines in the figures). Example array circuitry region 12 comprises a via region 24 at an end of each block segment 20 and proximate elongated major peripheral side 16. Via regions 24 comprise a plurality of elevationally extending conductive vias (not shown) which may connect with or engage access lines, sense lines, and/or other circuitry components extending from or associated with or engaging with memory cells arrayed within block segments 20. Via regions may comprise a stair step-like region where different conductive vias make connection to different elevation conductive lines extending from rows or columns of memory cells (not shown) in a single block segment 20. Via regions 24 may otherwise predominantly comprise dielectric back-fill material as described further below. By way of example only, dozens and more individual conductive vias may be within a single via region 24.

Array circuitry region 12 has a longitudinally non-linear edge 28 (FIGS. 2 and 2A) and adjacent circuitry region 14 has a longitudinally non-linear edge 30 at an interface 35 of array circuitry region 12 and adjacent circuitry region 14 relative one another along elongated major peripheral side 16 of array circuitry region 12. The array circuitry region and the adjacent circuitry region may have longitudinally non-linear edges at an interface relative one another along other of the elongated major peripheral sides of the array circuitry region, and in one embodiment along each of the elongated major peripheral sides of the periphery of the array circuitry region circumferentially about the array circuitry region. For example, array circuitry region 12 and adjacent circuitry region 14 in FIGS. 1 and 2 are also shown as having longitudinally non-linear edges 32 and 34 (FIG. 2), respectively, at an interface 37 relative one another along elongated major peripheral side 17 of array circuitry region 12. The discussion largely proceeds relative to the longitudinally non-linear edges of the array circuitry region and the adjacent circuitry region at interface 35 along major peripheral side 16, although such may apply along any other side assuming such includes longitudinally non-linear edges at such an interface of array circuitry region and adjacent circuitry region there-along relative one another.

In one example and as shown, array circuitry region non-linear edge 28 and adjacent circuitry region non-linear edge 30 comprise longitudinally-straight segments 36 and 38, respectively, that angle relative to elongated major peripheral side 16 of array circuitry region 12 (e.g., angles theta [θ] in FIG. 2A) and angle longitudinally with immediately longitudinally-adjacent of such longitudinally-straight segments along elongated major peripheral side 16 of array circuitry region 12 (e.g., angles phi [Φ] in FIG. 2A). Alternately as examples, longitudinally curved (not shown) or a combination of longitudinally curved and longitudinally-straight segments (not shown) may be used, including a substantially sinusoidal or other curvilinear (not shown) relationship, along interface 35. Regardless, the curved or longitudinally-straight segments need not be all of the same length along major peripheral side 16. Further, such segments when longitudinally straight do not need to all have the same angle θ relative a straight major peripheral side 16 and/or need not all have the same longitudinal angle Φ between immediately longitudinally-adjacent of such longitudinally-straight segments. In one embodiment, the angles of the longitudinally-straight segments 36 and 38 relative to the straight major peripheral side 16 of array circuitry region 12 are within 2.5° of one another along straight major peripheral side 16 of the array circuitry region 12 (e.g., angles θ in FIG. 2A). In one embodiment, each angle θ is acute, in one embodiment is at least 30°, in one embodiment is within 5° of 45° (i.e., including at exactly 45°), and in one embodiment is within 1.5° of 45 degrees. An angle θ of 45° may be ideal, for example as explained below. In one embodiment, angles Φ are within 2.5° of 90° (i.e., including at exactly 90°).

FIGS. 1, 2, and 2A show an embodiment wherein longitudinally non-linear edges 28 and 30 form a longitudinal series of regions 40 (only so designated in FIGS. 2 and 2A) of material 42 of array circuitry region 12 that project laterally into material 44 of adjacent circuitry region 14. In the example depicted embodiment of FIGS. 1, 2, and 2A, interfaces 35 and 37 have a zig-zag presentation and where, in one embodiment, individual of projecting regions 40 of array material 42 are individually of triangular shape in top view and/or a horizontal cross-section. Alternate embodiments may of course be used, for example as asserted above where some portions of interfaces 35 and 37 may be other than solely longitudinally-straight-segmented, may be wholly or partially curved, and/or have other orientation (not shown). Numerous more laterally-projecting regions 40 may be along major peripheral side 16, with one laterally-projecting region 40 being shown between and overlapping each pair of immediately-adjacent block segments 20 in the FIG. 2 example. In one embodiment, the number of laterally-projecting regions along an elongated major peripheral side of the array circuitry region is no less than 1,000. In one specific example, a memory array circuitry region 12 may include 1024 block segments whereby the number of laterally-projecting regions 40 along major peripheral side 16 may also be around 1024 in number.

In one embodiment, material 42 of array circuitry region 12 projects laterally into material 44 of adjacent circuitry region 14 a maximum distance "b" (FIG. 2A) and has an elevational thickness "h" (not shown in FIGS. 1, 2, and 2A, and described in more detail by way of example below), with the ratio of such values (i.e., b:h) in one embodiment being from 0.25 to 5. In one embodiment, laterally-projecting regions 40 individually have a maximum width "a", with the a:h ratio in one embodiment being from 0.25 to 20. As but one specific example, "a" is 9.764 microns, "b" is 7.5 microns, and "h" is 5.2 microns.

Figure 3:
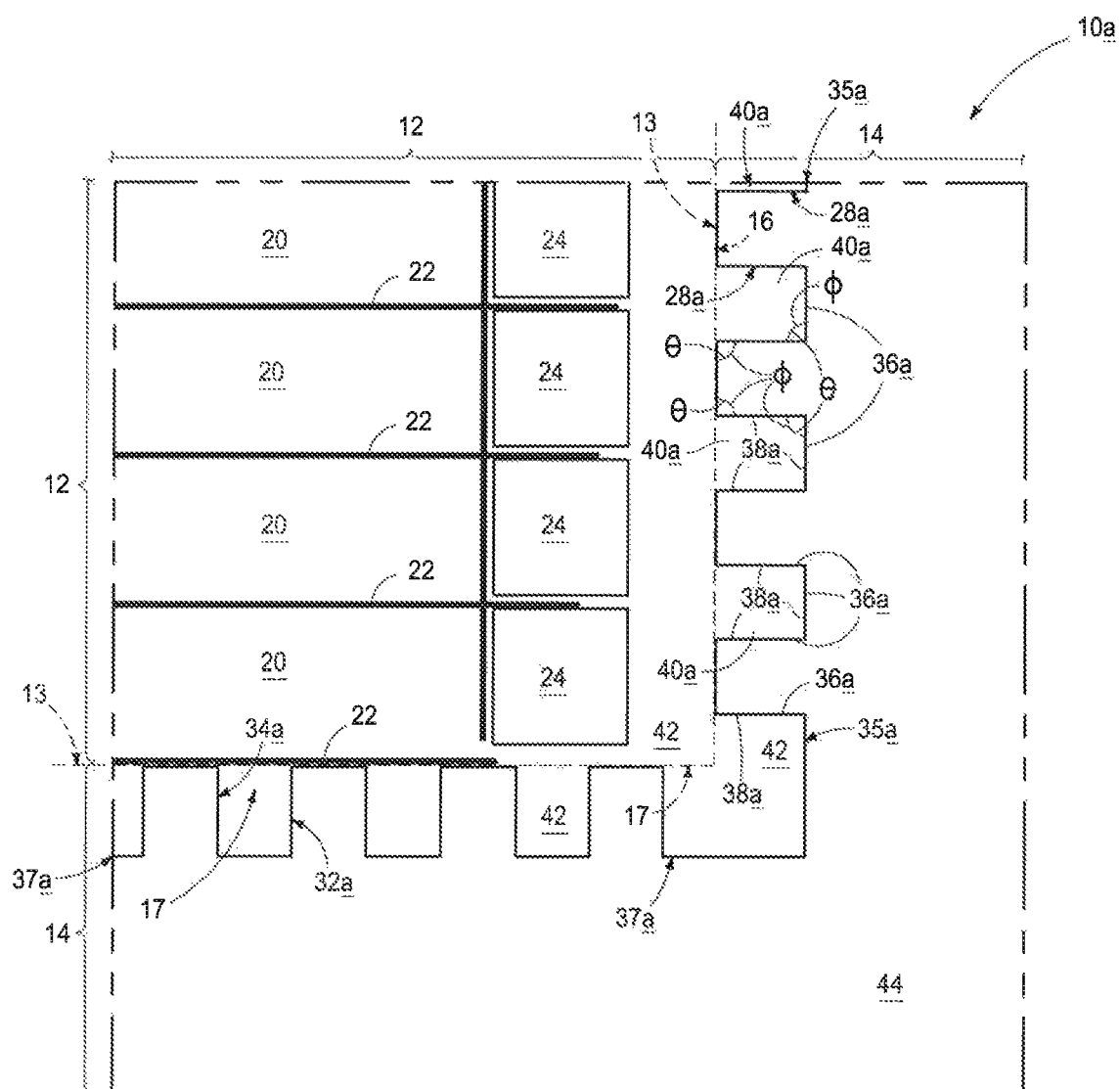
FIG. 3 is a diagrammatic top plan view of a substrate fragment comprising integrated circuitry in accordance with an embodiment of the invention, and corresponds in scale to that of FIG. 2.

While FIGS. 1, 2, and 2A show an embodiment wherein laterally-projecting regions 40 are of triangular shape in horizontal cross-section, FIG. 3 shows an alternate embodiment with respect to a substrate fragment 10a. Like numerals from the above-described embodiments have been used where appropriate, with some construction differences being indicated with the suffix "a". FIG. 3 is analogous in scale and position to the embodiments shown by FIG. 2 above. In FIG. 3, laterally-projecting regions 40a are quadrilateral and parallelogram in shape in horizontal cross-section. Further and regardless, FIG. 3 shows an example embodiment wherein each angle θ is 90° and also in one embodiment where each angle Φ is 90°. In one embodiment, each angle θ is within 2.5° of 90° (i.e., including at exactly 90°) and in one embodiment each angle Φ is within 2.5° of 90° (i.e., including at exactly 90°). Any other attribute(s) or aspect(s) as shown and/or described above may be used.

Figure 4:
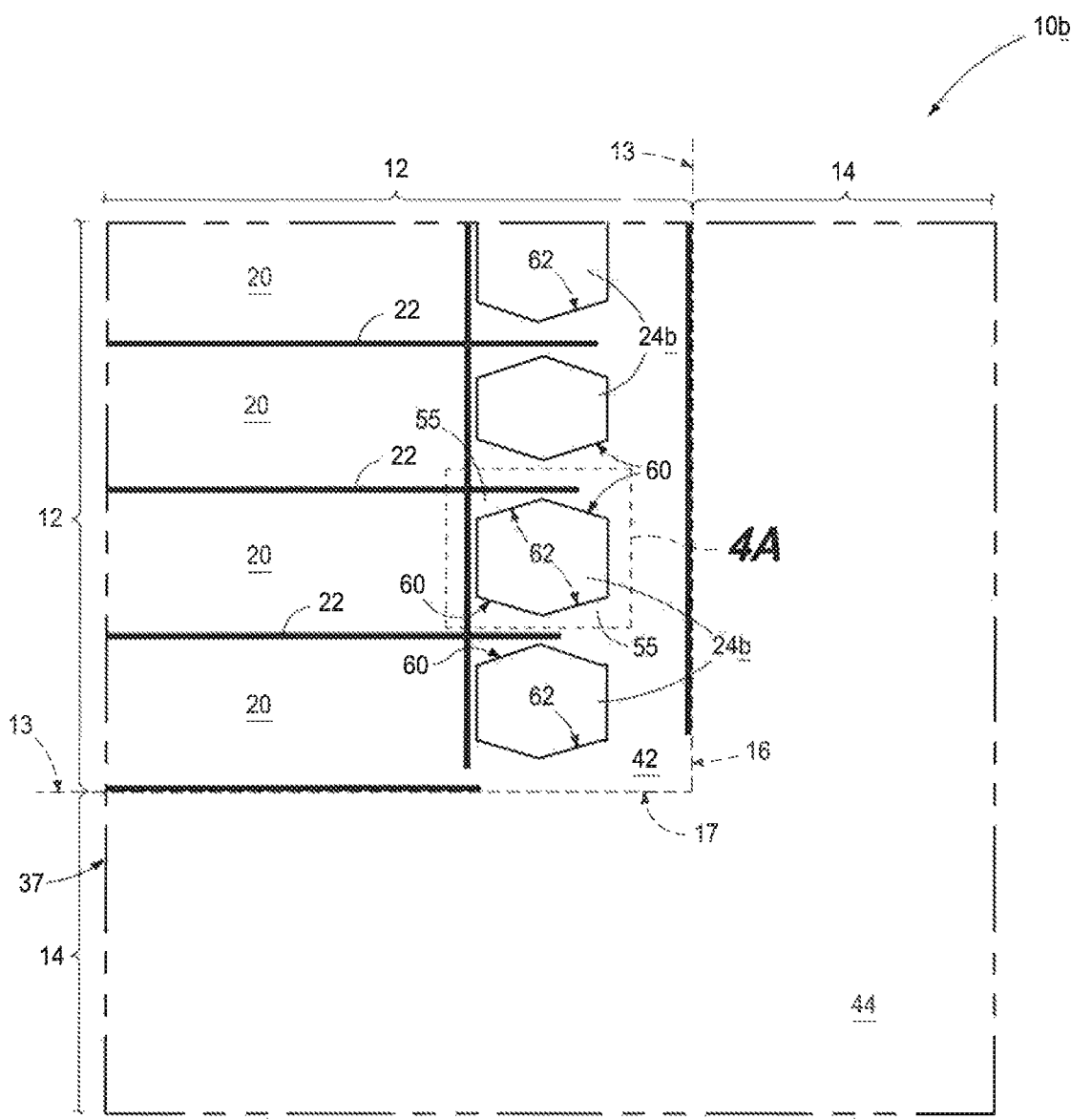
FIG. 4 is a diagrammatic top plan view of a substrate fragment comprising integrated circuitry in accordance with an embodiment of the invention, and corresponds in scale to that of FIG. 2.

Another example of integrated circuitry in accordance with an embodiment of the invention is next described with reference to FIGS. 4, 4A, and 5 with respect to a substrate fragment 10b. Like numerals from the above-described embodiments have been used where appropriate, with some construction differences being indicated with the suffix "b" or with different numerals. FIG. 4 is analogous in scale and position to the embodiments shown by FIGS. 2 and 3 above. Integrated circuitry of substrate fragment 10b also comprises an array circuitry region 12 comprising a repeating array of electronic components (not shown). Further, such integrated circuitry comprises an adjacent circuitry region 14 immediately laterally adjacent to and contacting elongated major peripheral side 16 of array circuitry region 12. Again, adjacent circuitry region 14 is distinct in structure from array circuitry region 12 where contacting array circuitry region 12 and is distinct in operation from array circuitry region 12.

Figure 4A:
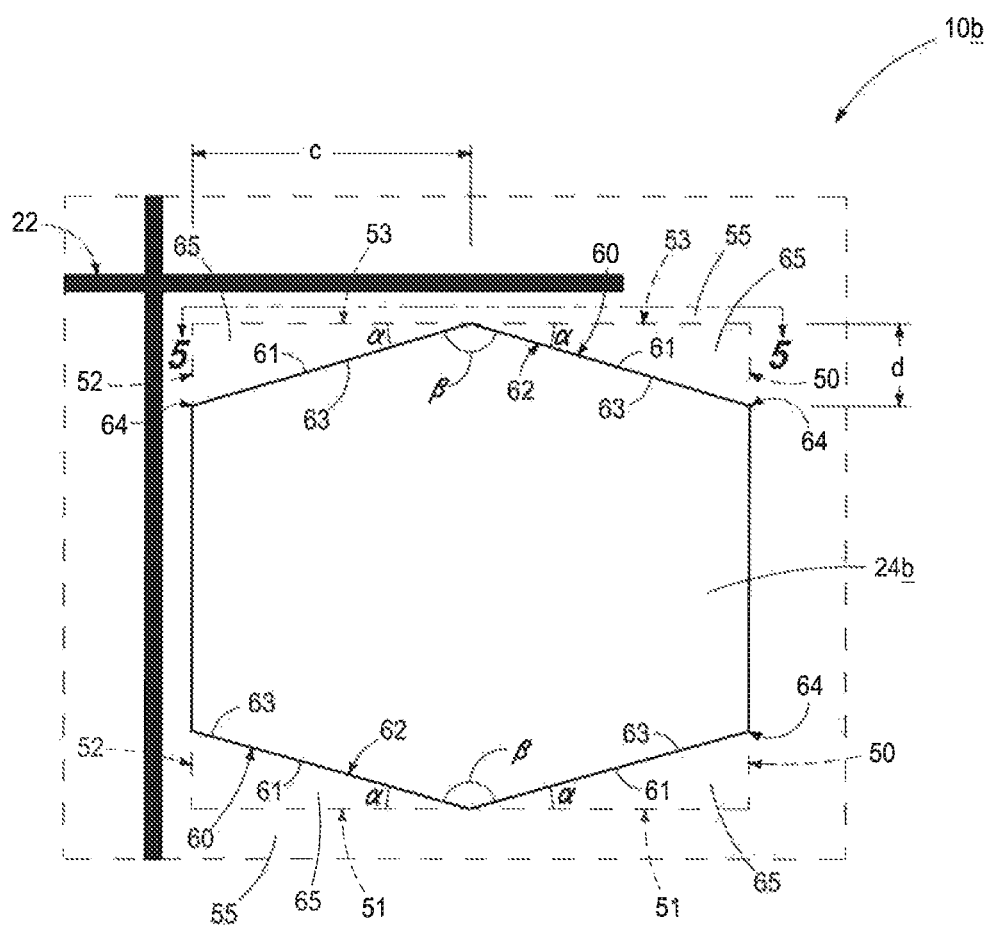
FIG. 4A is an enlarged view of a portion of FIG. 4.
Figure 5:
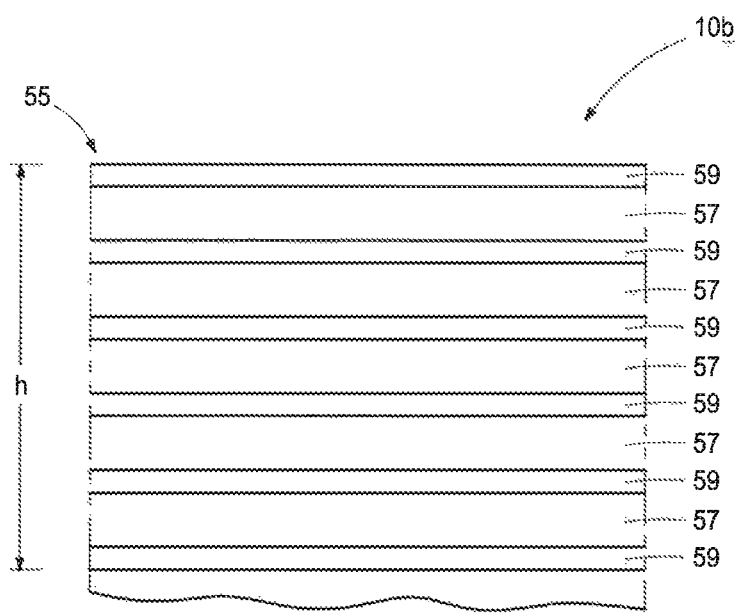
FIG. 5 is a diagrammatic sectional view taken through line 5-5 in FIG. 4A.

The integrated circuitry of FIGS. 4, 4A, and 5 differs in part from those as shown in FIGS. 1-3 in different configuration via regions 24b. Specifically, individual via regions 24b have four elongated major peripheral sides 50, 51, 52, and 53 (FIG. 4A). Array circuitry region 12 comprises a stack region 55 that is immediately laterally adjacent to and contacts one elongated major peripheral side (e.g., one of a side 51 and/or 53 in the depicted embodiment). Stack region 55 comprises a stack of tiers of different materials, for example alternating conductive material 57 and dielectric material 59 (FIG. 5), with conductive material 59 being used for array interconnect line material and for control gate material for vertical strings of memory cells within block segments 20. Although only a few layers of materials 57 and 59 are shown in FIG. 5, likely dozens and more of such vertically alternating materials may be included in stack region 55 and correspondingly in block segments 20. Stack region 55 and other portions of the substrates shown in all figures may have an elevational thickness "h" (FIG. 5), as may material 42 as described above. In one embodiment, material 42 of array circuitry region 12 as shown and described above with reference to FIGS. 2 and 2A may have the same structure and composition as stack region 55. Regardless, via region 24b has a longitudinally non-linear edge 60 (FIGS. 4 and 4A) and stack region 55 has a longitudinally non-linear edge 62 at an interface 64 of via region 24b and stack region 55 along elongated major peripheral side 51 and/or 53 of via region 24b. In one embodiment and as shown, longitudinally non-linear edges 60 and 62 form a longitudinal series of regions 65 (longitudinal relative to non-linear stack edge 62) of stack region 55 that project laterally into material of via region 24b a maximum distance "d" and that have an elevational thickness "h", with the ratio of such values (i.e., d:h) being from 0.05 to 1.0. In one embodiment, laterally-projecting regions 65 have a maximum width "c", with c:h being from 0.1 to 4.0. As but one specific example, "c" is 1.799 microns, "d" is 1.928 microns, and "h" is 5.2 microns.

In one example and as shown, via region non-linear edge 60 and stack region non-linear edge 62 comprise longitudinally-straight segments 61 and 63, respectively, that angle relative to elongated major peripheral side 53 or 51 (e.g., angles alpha [α] in FIG. 4A) and angle longitudinally with immediately longitudinally-adjacent of such longitudinally-straight segments along elongated major peripheral side 53 or 51 (e.g., angles beta [β] in FIG. 4A). Alternately as examples, longitudinally curved (not shown) or a combination of longitudinally curved and longitudinally-straight segments (not shown) may be used, including a substantially sinusoidal or other curvilinear (not shown) relationship, along interface 64. Regardless, the curved or longitudinally-straight segments need not be all of the same length along major peripheral side 53 or 51. Further, such segments when longitudinally straight do not need to all have the same angle α relative a straight major peripheral side 16 and/or need not all have the same longitudinal angle β between immediately longitudinally-adjacent of such longitudinally-straight segments (e.g., when more than two [not shown] of each of segments 61 and 63 are present along an elongated major peripheral side). In one embodiment, the angles of the longitudinally-straight segments 61 and 63 relative to the straight major peripheral side 51 or 53 are within 2.5° of one another along straight major peripheral side 51 or 53 (e.g., angles α in FIG. 4A). In one embodiment, each angle α is acute.

Figure 6:
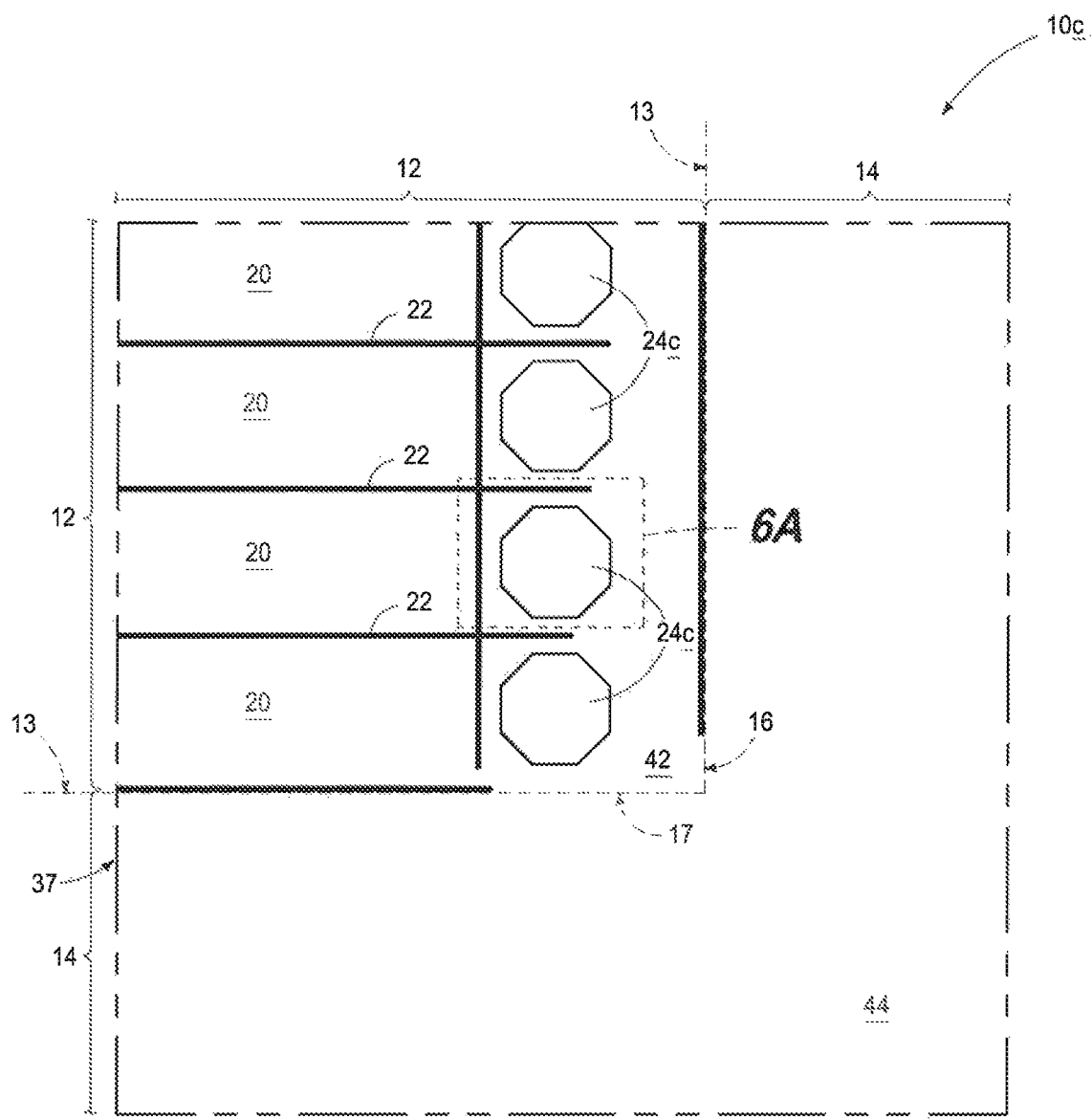
FIG. 6 is a diagrammatic top plan view of a substrate fragment comprising integrated circuitry in accordance with an embodiment of the invention, and corresponds in scale to that of FIG. 2.
Figure 6A:
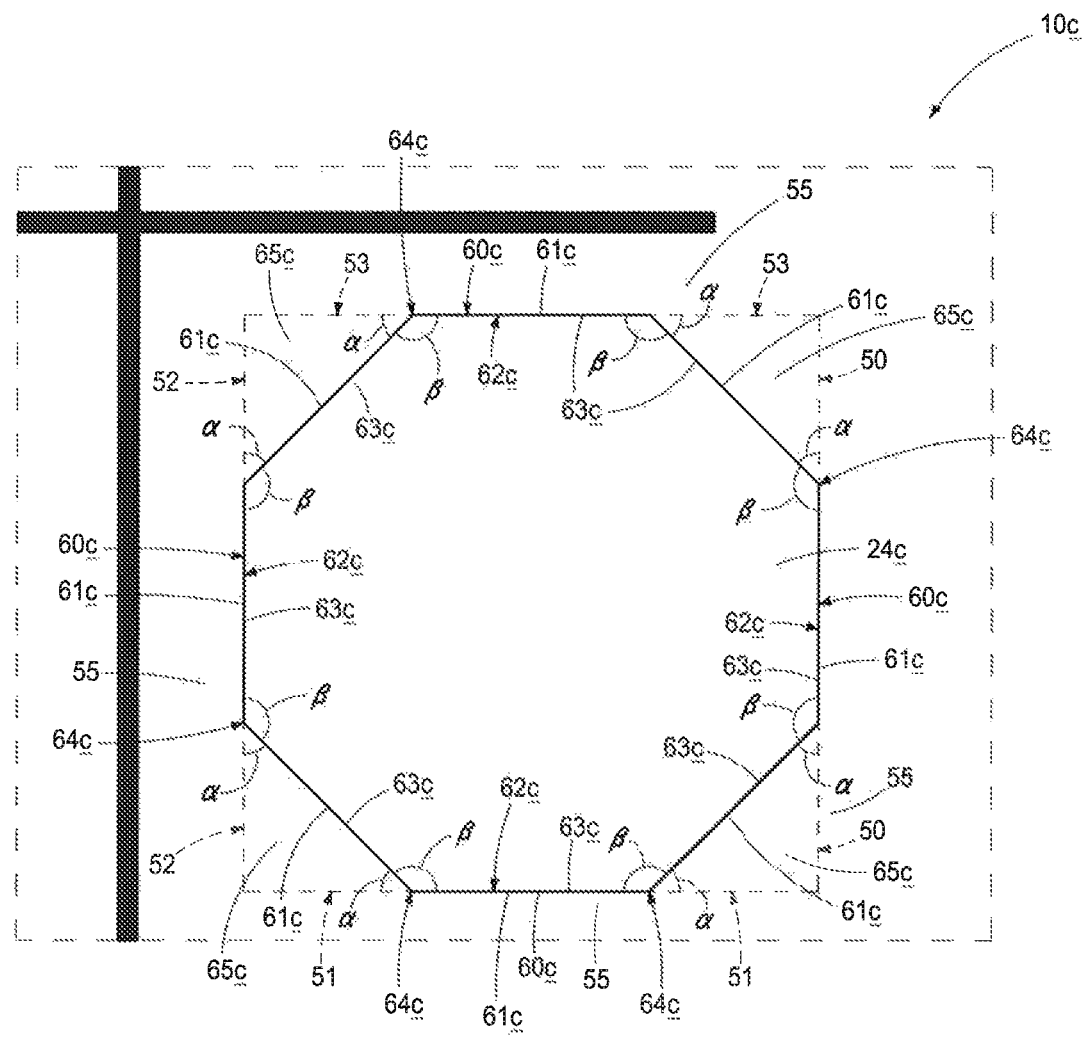
FIG. 6A is an enlarged view of a portion of FIG. 6.

The integrated circuitry of FIGS. 4, 4A, and 5 also differs in part from those as shown in FIGS. 1-3 in that array circuitry region 12 and adjacent circuitry region 14 have respective longitudinally linear edges (i.e., they do not have longitudinally non-linear edges) at an interface relative one another along their straight major peripheral sides 16 and 17 of array circuitry region 12. However and regardless, any other attribute(s) or aspect(s) as shown and/or described above may be used Alternate example embodiment integrated circuitry is next described with reference to FIGS. 6 and 6A with respect to a substrate fragment 10c. Like numerals from the above-described embodiments have been used where appropriate, with some construction differences being indicated with the suffix "c" or with different numerals. Individual via regions 24c have four elongated major peripheral sides 50, 51, 52, and 53 (FIG. 6A). Stack regions 55 are immediately laterally adjacent to and contact a respective elongated major such peripheral side 50, 51, 52, or 53, and may have elevational thickness "h" (not visible in FIGS. 6 and 6A). Via region 24c has a longitudinally non-linear edge 60c (FIGS. 4 and 4A) and stack region 55 has a longitudinally non-linear edge 62c at an interface 64c of via region 24c and stack region 55 along each major peripheral side 50, 51, 52, and 53 of via region 24c. In one example and as shown, via region non-linear edges 60c and stack region non-linear edge 62c comprise longitudinally-straight segments 61c and 63c, respectively, that angle relative to their respective elongated major peripheral side (e.g., angles α in FIG. 6A) and angle longitudinally with immediately longitudinally-adjacent of such longitudinally-straight segments along elongated their respective elongated major peripheral side (e.g., angles β in FIG. 6A). In one embodiment and as shown, longitudinally non-linear edges 60c and 62c form a longitudinal series of regions 65c (e.g., longitudinally along their respective elongated major peripheral side 50, 51, 52, or 53) of stack region 55 that project laterally into material of via region 24c. Any other attribute(s) or aspect(s) as shown and/or described above may be used.

In one embodiment and for example as shown in each of the FIGS. 4/5/5A and 6/6A embodiments, the number of longitudinally-straight segments along the one major peripheral side of a via region is no more than 3 in number, and in one embodiment only 2 in number. For example, FIGS. 4/5/5A show an embodiment wherein a major peripheral side 51 or 53 of a via region 24b has only two laterally-projecting regions 65. FIGS. 6/6A show an embodiment wherein a major peripheral side 51, 52, 53, or 54 of a via region 24c has only two laterally-projecting regions 65c.

Figure 7:
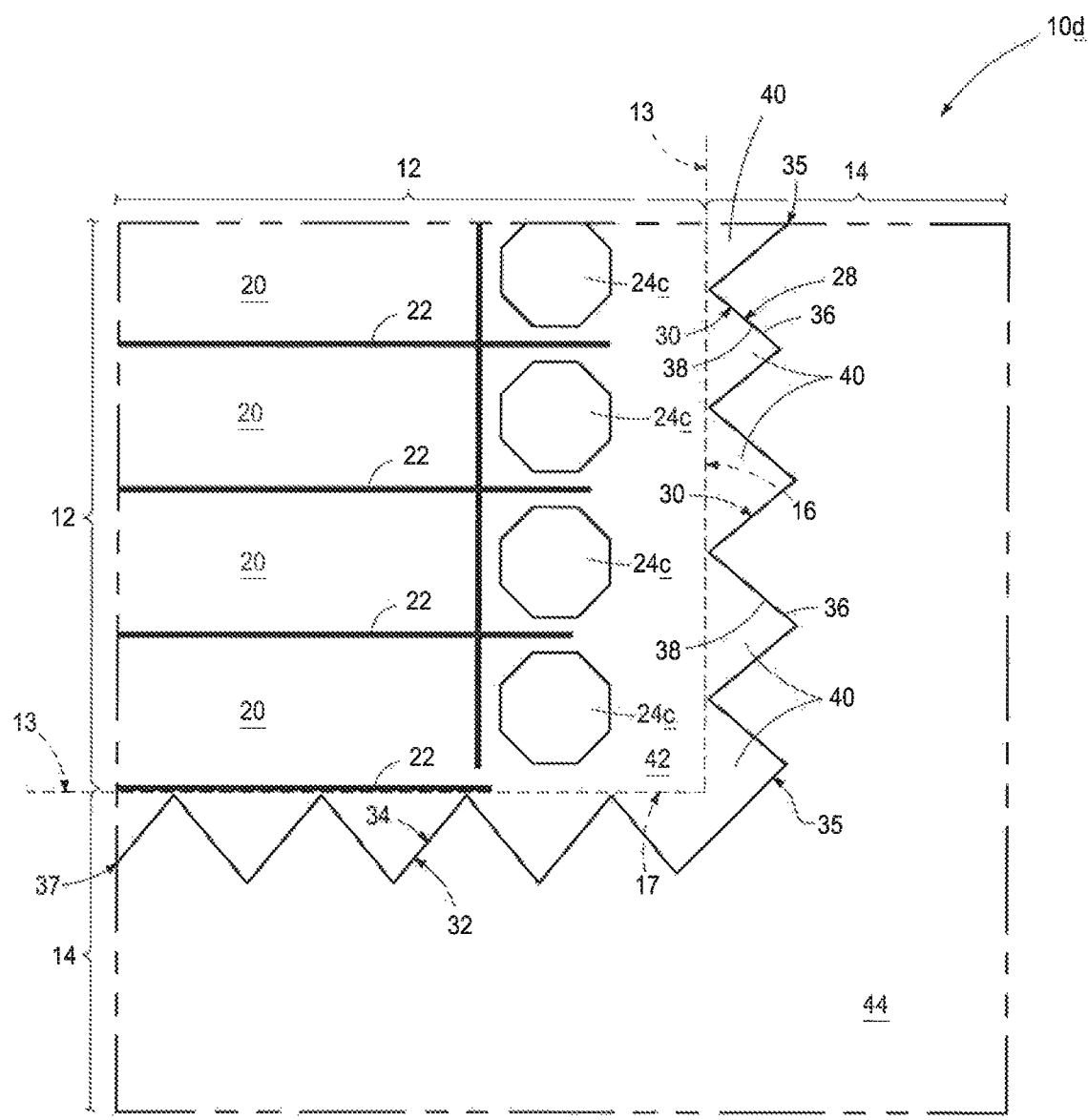
FIG. 7 is a diagrammatic top plan view of a substrate fragment comprising integrated circuitry in accordance with an embodiment of the invention, and corresponds in scale to that of FIG. 2.

Alternate example integrated circuitry in accordance with an embodiment of the invention is also shown and next described with reference to FIG. 7 with respect to a substrate fragment 10d. Like numerals from the above-described embodiments have been used where appropriate, with some construction differences being indicated with the suffix "d". FIG. 7 combines aspects of the FIGS. 6/6A construction regarding via regions 24c and of the FIGS. 1/2/2A construction regarding longitudinally non-linear edges at an interface relative the array circuitry region and the adjacent circuitry region along an elongated major peripheral side of the array circuitry region. Any other attribute(s) or aspect(s) as shown and/or described above may be used. For example, alternate combinations of the above depicted examples, as well as other examples, may be used.

Figure 8:
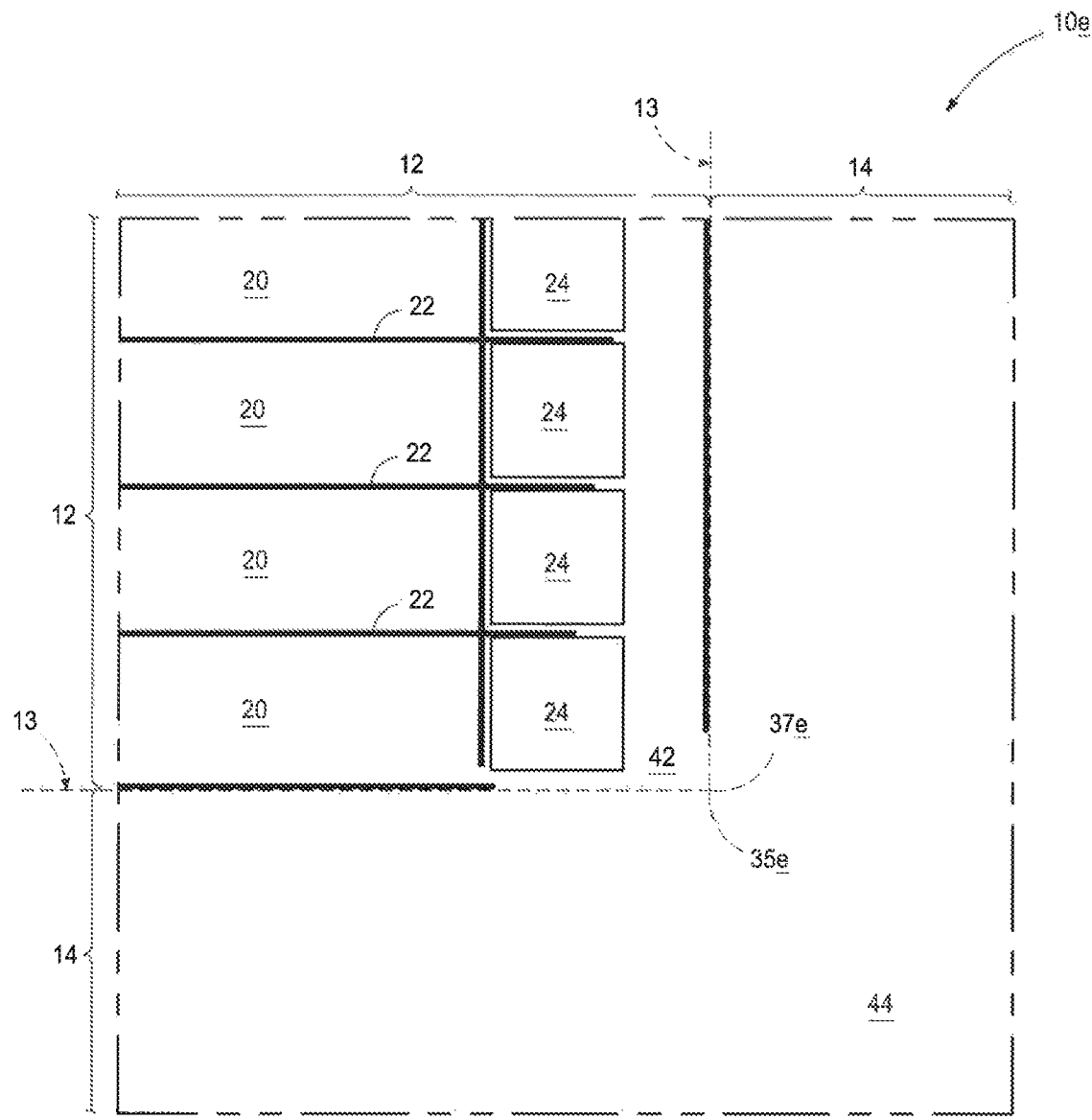
FIG. 8 is a diagrammatic top plan view of a substrate fragment in accordance with a non-invention predecessor construction, and corresponds in scale to that of FIG. 2.

FIG. 8 shows a predecessor substrate fragment 10e (i.e., not in accordance with any embodiment of the invention). Like numerals from the above-described embodiments have been used where appropriate, with some construction differences being indicated with the suffix "e". Array circuitry region 12 and adjacent circuitry region 14 do not have a respective longitudinally non-linear edge at an interface 35e/37e relative one another along any elongated major peripheral side of array circuitry region 12 (i.e., their respective longitudinally non-linear edge is everywhere longitudinally straight). Further, although the array circuitry region comprises via regions (e.g., regions 24), such via regions and stack regions adjacent thereto also do not have a respective longitudinally non-linear edge at an interface relative one another along any elongated major peripheral side of a via region.

Figure 9:
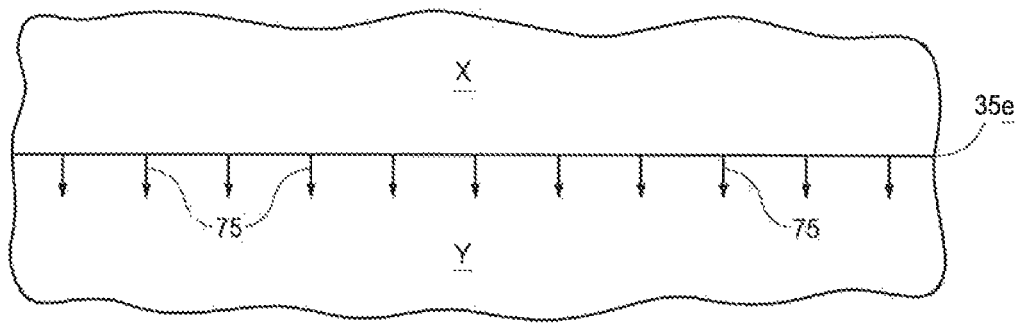
FIGS. 9-11 are enlarged diagrammatic top plan views of portions of some of the substrate fragments referred to above.
Figure 10:
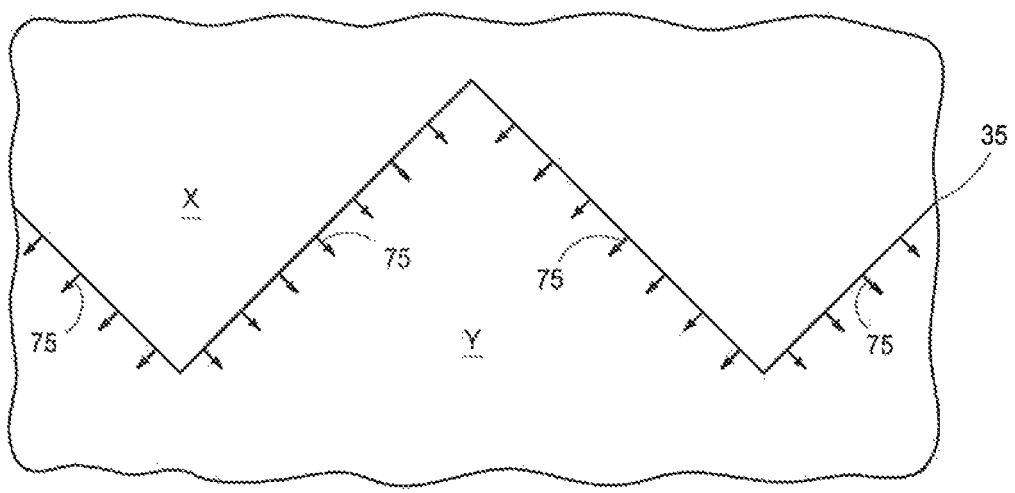
Figure 11:
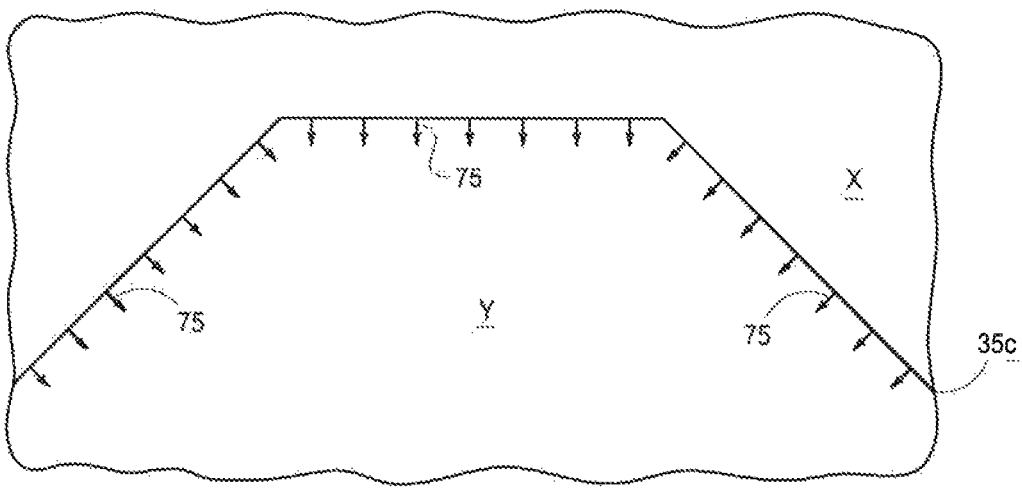

FIGS. 9-11 show portions of the three interfaces 35e, 35, and 35c, respectively, and theoretical force vectors 75. Such are used to describe improved attributes that may be achieved with embodiments of the invention in comparison to predecessor interfaces of immediately laterally-adjacent array circuitry regions and adjacent circuitry regions arrays. Such are also used to describe improved attributes that may be achieved with embodiments of the invention in comparison to predecessor interfaces of a stack region comprising a stack of tiers of different materials within an array circuitry region that is immediately laterally adjacent to and contacting one elongated major peripheral side of a via region.

FIG. 9 shows the entirely longitudinally-straight-linear edge interface 35e relative an array circuitry region material X and an adjacent circuitry array Y, wherein Y may exert lateral stress/force relative to X due to densification and shrinkage of Y relative to X. Such is indicated by force vectors 75 which are all parallel relative one another and orthogonal to longitudinally-straight-linear edge interface 35e. Accordingly, such force vectors 75 relative to a vertical slit (not shown) in material X (or in generating an undesired crack in material X) is strong or strongest as occurring all in the same direction (e.g., all vertical downward in FIG. 9).

Consider FIG. 10 corresponding in design to the interface 35 of the construction of FIGS. 1/2/2A. While force vectors 75 are still locally orthogonal to interface 35 between materials X and Y, such are collectively not all parallel relative one another, thereby diffusing and reducing any lateral-pulling effect of material Y relative to material X. Analogously, FIG. 11 corresponds to a structure like that of FIGS. 6 and 6A again wherein collectively all of force vectors 75 are not parallel relative one another.

It is believed that the FIGS. 10 and 11-depicted ideal 45° angling relative to the respective elongated major peripheral side ($\theta$ as shown in FIG. 2A, $\alpha$ as shown in FIG. 6A) will result in the greatest reduction of lateral-pulling effect.

Laterally-projecting regions 40/65/65c may be considered as being buttresses which effectively provide a buttressing-effect providing lateral support to the array circuitry region that may reduce or preclude it from being pulled laterally to the degree described in the Background section of this document and with respect to the FIGS. 8 and 9 constructions.

CONCLUSION

In some embodiments, integrated circuitry comprises an array circuitry region comprising a repeating array of electronic components. An adjacent circuitry region is immediately laterally adjacent to and contacts one elongated major peripheral side of the array circuitry region. The adjacent circuitry region is distinct in structure from the array circuitry region where contacting the array circuitry region and distinct in operation from the array circuitry region. The array circuitry region and the adjacent circuitry region have a respective longitudinally non-linear edge at an interface relative one another along the one elongated major peripheral side of the array circuitry region.

In some embodiments, integrated circuitry comprises an array circuitry region comprising a repeating array of electronic components. An adjacent circuitry region is immediately laterally adjacent to and contacts one elongated major peripheral side of the array circuitry region. The adjacent circuitry region is distinct in structure from the array circuitry region where contacting the array circuitry region and distinct in operation from the array circuitry region. The array circuitry region comprises a via region proximate the one elongated major peripheral side of the array circuitry region and in which a plurality of conductive vias elevationally extend. The array circuitry region comprises a stack region comprising a stack of tiers of different materials that is immediately laterally adjacent to and contacts one elongated major peripheral side of the via region. The via region and the stack region have a respective longitudinally non-linear edge at an interface relative one another along the one elongated major peripheral side of the via region.

In some embodiments, three-D memory comprises an array circuitry region comprising a plurality of elevationally extending strings of memory cells and a periphery having a plurality of straight major peripheral sides. A peripheral circuitry region surrounds and contacts each of the straight major peripheral sides of the periphery of the array circuitry region. The array circuitry region and the peripheral circuitry region have a respective longitudinally non-linear edge at an interface relative one another along individual of the straight major peripheral sides of the periphery of the array circuitry region circumferentially about the array circuitry region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Three-D (3D) NAND memory circuitry, comprising:
  a stack of tiers of different materials in a memory array circuitry region that comprises a repeating array of elevationally extending strings of memory cells;
  adjacent material in an adjacent circuitry region immediately laterally adjacent to and contacting one elongated major peripheral side of the memory array circuitry region, the adjacent circuitry region being distinct in structure from the memory array circuitry region where contacting the memory array circuitry region and distinct in operation from the memory array circuitry region, the memory array circuitry region and the adjacent circuitry region having a respective longitudinally non-linear edge at an interface relative one another along the one elongated major peripheral side of the memory array circuitry region; and
  the stack of tiers of different materials projecting laterally from the memory array circuitry region into the adjacent circuitry region, the adjacent material projecting laterally from the adjacent circuitry region into the memory array circuitry region.

2. The 3D NAND memory circuitry of claim 1 wherein the stack of tiers of different materials comprises vertically alternating conductive material and dielectric material.

3. The 3D NAND memory circuitry of claim 1 wherein the adjacent material comprises dielectric material.

4. The 3D NAND memory circuitry of claim 1 wherein the adjacent material is dielectric material.

5. The 3D NAND memory circuitry of claim 1 wherein,
  the stack of tiers of different materials comprises vertically alternating conductive material and dielectric material; and
  the adjacent material comprises dielectric material.

6. The 3D NAND memory circuitry of claim 1 wherein,
  the stack of tiers of different materials comprises vertically alternating conductive material and dielectric material; and
  the adjacent material is dielectric material.

7. The 3D NAND memory circuitry of claim 1 wherein the one major peripheral side of the memory array circuitry region is straight, the memory array circuitry region non-linear edge and the adjacent circuitry region non-linear edge comprise respective longitudinally-straight segments that angle relative to the one straight major peripheral side of the memory array circuitry region and angle longitudinally with immediately longitudinally-adjacent of said longitudinally-straight segments along the one straight major peripheral side of the memory array circuitry region.

8. The 3D NAND memory circuitry of claim 7 wherein the angles of said longitudinally-straight segments relative to the one straight major peripheral side of the memory array circuitry region are within 2.5° of one another along the one straight major peripheral side of the memory array circuitry region.

9. The 3D NAND memory circuitry of claim 7 wherein each of the angles of said longitudinally-straight segments relative to the one straight major peripheral side of the memory array circuitry region is acute.

10. The 3D NAND memory circuitry of claim 9 wherein each of the angles of said longitudinally-straight segments relative to the one straight major peripheral side of the memory array circuitry region is at least 30°.

11. The 3D NAND memory circuitry of claim 10 wherein each of the angles of said longitudinally-straight segments relative to the one straight major peripheral side of the memory array circuitry region is within 5° of 45°.

12. The 3D NAND memory circuitry of claim 1 wherein the memory array circuitry region non-linear edge and the adjacent circuitry region non-linear edge comprise respective longitudinally-straight segments that angle longitudinally with immediately longitudinally-adjacent of said longitudinally-straight segments along the one elongated major peripheral side of the memory array circuitry region, each of the longitudinal angles between said immediately longitudinally-adjacent of said longitudinally-straight segments being within 2.5° of 90° along the one elongated major peripheral side of the memory array circuitry region.

13. The 3D NAND memory circuitry of claim 12 wherein the one major peripheral side of the memory array circuitry region is straight, all of the longitudinally-straight segments angling relative to the one straight major peripheral side of the memory array circuitry region within 2.5° of 90° along the one straight major peripheral side of the memory array circuitry region.

14. The 3D NAND memory circuitry of claim 1 wherein the longitudinally non-linear edges form a longitudinal series of regions of material of the memory array circuitry region that project laterally into material of the adjacent circuitry region, individual of said projecting regions of memory array material being triangular in shape in a horizontal cross-section.

15. The 3D NAND memory circuitry of claim 1 wherein the longitudinally non-linear edges form a longitudinal series of regions of material of the memory array circuitry region that project laterally into material of the adjacent circuitry region a maximum distance "b" and that have an elevational thickness "h"; b:h being from 0.25 to 5.

16. The 3D NAND memory circuitry of claim 1 wherein the longitudinally non-linear edges form a longitudinal series of regions of material of the memory array circuitry region that project laterally into material of the adjacent circuitry region, that have a maximum width "a", and that have an elevational thickness "h"; a:h being from 0.25 to 20.

17. The 3D NAND memory circuitry of claim 16 wherein the longitudinal series of regions of material of the memory array circuitry region that project laterally into material of the adjacent circuitry region do so a maximum distance "b", b:h being from 0.25 to 5.

18. The 3D NAND memory circuitry of claim 1 wherein the memory array circuitry region comprises a via region proximate the one elongated major peripheral side of the memory array circuitry region and in which a plurality of conductive vias elevationally extend, the memory array circuitry region comprising a stack region comprising a stack of tiers of different materials that is immediately laterally adjacent to and contacting one elongated major peripheral side of the via region, the via region and the stack region having a respective longitudinally non-linear edge at an interface relative one another along the one elongated major peripheral side of the via region.

19. Three-D (3D) NAND memory circuitry, comprising:
a stack region comprising a stack of tiers of different materials in a memory array circuitry region that comprises a repeating array of elevationally extending strings of memory cells;
adjacent dielectric material in an adjacent circuitry region immediately laterally adjacent to and contacting one elongated major peripheral side of the memory array circuitry region, the adjacent circuitry region being distinct in structure from the memory array circuitry region where contacting the memory array circuitry region and distinct in operation from the memory array circuitry region, the memory array circuitry region comprising a via region proximate the one elongated major peripheral side of the memory array circuitry region and in which a plurality of conductive vias elevationally extend; and
the tiers of different materials in the stack region being immediately laterally adjacent to and contacting one elongated major peripheral side of the via region, the via region and the stack region having a respective longitudinally non-linear edge at an interface relative one another along the one elongated major peripheral side of the via region.

20. The 3D NAND memory circuitry of claim 19 wherein the stack of tiers of different materials comprises vertically alternating conductive material and dielectric material.

21. The 3D NAND memory circuitry of claim 19 wherein the longitudinally non-linear edges form a longitudinal series of regions of material of the stack region that project laterally into material of the via region a maximum distance "d" and that have an elevational thickness "h"; d:h being from 0.05 to 1.0.

22. The 3D NAND memory circuitry of claim 19 wherein the longitudinally non-linear edges form a longitudinal series of regions of material of the stack region that project laterally into material of the via region, that have a maximum width "c", and that have an elevational thickness "h"; c:h being from 0.1 to 4.0.

23. The 3D NAND memory circuitry of claim 19 wherein the longitudinally non-linear edges form a longitudinal series of regions of material of the stack region that project laterally into material of the via region, number of such laterally-projecting regions along the one elongated major peripheral side being no more than 3.

24. Three-D (3D) NAND memory circuitry, comprising:
a stack of tiers of different materials in a memory array circuitry region that comprises a plurality of elevationally extending strings of memory cells and a periphery having a plurality of straight major peripheral sides;
adjacent material in an adjacent circuitry region that surrounds and contacts each of the straight major peripheral sides of the periphery of the memory array circuitry region; and
the stack of tiers of different materials of the memory array circuitry region and the peripheral circuitry region having a respective longitudinally non-linear edge at an interface relative one another along individual of the straight major peripheral sides of the periphery of the memory array circuitry region circumferentially about the memory array circuitry region.

25. The 3D NAND memory circuitry of claim 24 wherein the stack of tiers of different materials comprises vertically alternating conductive material and dielectric material.

26. The 3D NAND memory circuitry of claim 24 wherein the memory array circuitry region comprises a plurality of spaced via regions proximate the memory array circuitry region periphery and individually in which a plurality of conductive vias elevationally extend, the memory array circuitry region comprising a stack region comprising a stack of tiers of different materials that is laterally adjacent to and contacts at least one straight major peripheral side of individual of the via regions, the individual via regions and the stack region having a respective longitudinally non-linear edge at respective interfaces relative one another along the one straight major peripheral side of the respective via regions.

27. The 3D NAND memory circuitry of claim 24 wherein the longitudinally non-linear edges form a longitudinal series of regions of material of the memory array circuitry region that project laterally into material of the peripheral circuit region, number of said projecting regions of material of the memory array circuitry region being no less than 1,000 along individual of the straight major peripheral sides.

* * * * *